(12) United States Patent
Takeshima et al.

(10) Patent No.: US 6,794,799 B2
(45) Date of Patent: Sep. 21, 2004

(54) PIEZOELECTRIC ELECTROACOUSTIC TRANSDUCER

(75) Inventors: Tetsuo Takeshima, Toyama (JP); Yuji Kosugi, Toyama (JP); Manabu Sumita, Toyama (JP)

(73) Assignee: Murata Manufacturing Co., Ltd., Kyoto (JP)

(*) Notice: Subject to any disclaimer, the term of this patent is extended or adjusted under 35 U.S.C. 154(b) by 228 days.

(21) Appl. No.: 10/186,895

(22) Filed: Jul. 2, 2002

(65) Prior Publication Data
US 2003/0034714 A1 Feb. 20, 2003

(30) Foreign Application Priority Data
Aug. 20, 2001 (JP) ........................... 2001-248458

(51) Int. Cl.$^7$ ............................... H01L 41/08
(52) U.S. Cl. ................. 310/348; 310/344; 310/345
(58) Field of Search ............... 310/344, 348.3, 310/53, 356

(56) References Cited

U.S. PATENT DOCUMENTS

| | | | |
|---|---|---|---|
| 3,751,692 A | * 8/1973 | Choffat | 310/344 |
| 3,970,880 A | * 7/1976 | Deutschmann et al. | 310/344 |
| 4,273,399 A | * 6/1981 | Myers et al. | 439/74 |
| 4,486,681 A | * 12/1984 | Ishigami et al. | 310/353 |
| 4,639,632 A | * 1/1987 | Nakata et al. | 310/353 |
| 5,925,970 A | * 7/1999 | Unami et al. | 310/328 |

FOREIGN PATENT DOCUMENTS

| | | |
|---|---|---|
| JP | 2000-310990 | 11/2000 |
| JP | 2001-95094 | 4/2001 |

* cited by examiner

Primary Examiner—Mark Budd
(74) Attorney, Agent, or Firm—Keating & Bennett, LLP (57) ABSTRACT

A piezoelectric electroacoustic transducer includes a piezoelectric diaphragm having a substantially rectangular shape which vibrates in the thickness direction when an alternating current is applied between electrodes of the piezoelectric diaphragm, a housing which stores the piezoelectric diaphragm, and a pair of terminals formed in the housing by insert molding. One end of each terminal is inserted inside the housing and includes a body portion fixed to the housing and wing portions which extend from both sides of the body portion toward the corners of the housing. The wing portions are not fixed to the housing, and stress-relieving portions are disposed between the body portion and the wing portions so that the wing portions are able to move toward the inside of the housing. Each electrode of the piezoelectric diaphragm is connected to at least one of the wing portions of the terminals by a conductive adhesive.

20 Claims, 6 Drawing Sheets

POLARIZATION AXIS

Fig. 6

POLARIZATION DIRECTION

PIEZOELECTRIC ELECTROACOUSTIC TRANSDUCER

BACKGROUND OF THE INVENTION

1. Field of the Invention

The present invention relates to a piezoelectric electroacoustic transducer such as a piezoelectric receiver and a piezoelectric sounder.

2. Description of the Related Art

Conventional piezoelectric electroacoustic transducers are commonly used in electronic devices, household electric appliances, mobile phones, etc., as piezoelectric sounders for producing alarm sounds and operation sounds or as piezoelectric receivers. Piezoelectric electroacoustic transducers are generally constructed by adhering a circular piezoelectric device on a circular metal plate so as to define a unimorph-type diaphragm, installing the metal plate in a circular case such that the metal plate is supported by silicone rubber at the periphery thereof, and closing an opening of the case with a cover.

However, when a circular diaphragm is used, there are problems in that production efficiency and efficiency in electroacoustic conversion are low and it is difficult to reduce the size of the device.

Accordingly, Japanese Unexamined Patent Application Publication No. 2000-310990 discloses a surface-mountable piezoelectric electroacoustic transducer in which a diaphragm having a rectangular shape is used so that the production efficiency and the efficiency in electroacoustic conversion can be increased and the size of the device can be reduced. This piezoelectric electroacoustic transducer includes a piezoelectric diaphragm having a rectangular shape, an insulating case having supporters for supporting the diaphragm between two opposing sides of the case and terminals which are attached to the supporters and provide connections to the external environment, and a cover plate in which a sound-emitting hole is formed. The diaphragm is installed inside the case, and two opposing side surfaces of the diaphragm are fixed to the supporters with an elastic sealing material. In addition, clearances between the remaining two sides of the diaphragm and the case are sealed with the elastic sealing material. First and second conductive members are electrically connected to the diaphragm with a conductive adhesive, and the cover plate is adhered on the case so as to close an opening of the case disposed at one side thereof.

Although the above-described piezoelectric electroacoustic transducer uses a unimorph-type piezoelectric diaphragm, a piezoelectric electroacoustic transducer using a piezoelectric diaphragm including a piezoelectric ceramic having a laminated structure is also known in the art (Japanese Unexamined Patent Application Publication No. 2001-95094).

According to the known art, the diaphragm is fixed and connected to the terminals, which are fixed to the case, by a conductive adhesive at two sides thereof. Therefore, there is a problem in that the diaphragm is strongly restrained by the case, and if, for example, thermal deformation of the case occurs, it directly affects the diaphragm. When the case is mounted on a printed board by reflow-soldering, thermal expansion of the case occurs. In such a case, characteristics of the diaphragm change due to the difference between the coefficient of thermal expansion of the case and that of the diaphragm. In addition, when a stress is applied to the case, the stress is directly transferred to the diaphragm. Accordingly, there is a risk in that characteristics of the diaphragm will change or the diaphragm will break.

SUMMARY OF THE INVENTION

In order to overcome the problems described above, preferred embodiments of the present invention provide a piezoelectric electroacoustic transducer in which thermal deformation of the case and a stress applied to the case do not affect the diaphragm and in which the change in characteristics of the diaphragm is minimized.

According to a preferred embodiment of the present invention, a piezoelectric electroacoustic transducer includes a piezoelectric diaphragm having a substantially rectangular shape which vibrates in the thickness direction when an-alternating current is applied between electrodes of the piezoelectric diaphragm, a housing which stores the piezoelectric diaphragm and which includes supporting portions for supporting the piezoelectric diaphragm at at least two opposing sides of the piezoelectric diaphragm or at corners of the piezoelectric diaphragm, and a pair of terminals disposed and insert molded in the housing such that a first end of each terminal is inserted inside the housing at a position close to the supporting portions and a second end of each of the pair of terminals is disposed outside the housing. The first end of each of the pair of terminals includes a body portion fixed to the housing, wing portions which extend from both sides of the body portion toward the corners of the housing and which are not fixed to the housing, and stress-relieving portions disposed between the body portion and the wing portions such that the wing portions are able to move toward the inside of the housing. Each electrode of the piezoelectric diaphragm is connected to at least one of the wing portions of the terminals.

According to the present preferred embodiment of the present invention, one end of the terminal which is inserted inside the housing is provided with a body portion and wing portions which extend from both sides of the body portions. The body portion is fixed to the housing and the wing portions are able to move relative to the housing. In addition, stress-relieving portions are disposed between the body portion and the wing portions so that the wing portions are able to move toward the inside of the housing. At least one of the wing portions is connected to one of the electrodes of the piezoelectric diaphragm preferably via a conductive adhesive. When a temperature change occurs or an external force is applied, a stress generated due to the temperature change or the external force is transferred toward the piezoelectric diaphragm. However, the wing portions of the terminals are bent toward the inside of the housing so as to absorb the stress, so that the stress is prevented from being transferred to the piezoelectric diaphragm. Therefore, the piezoelectric diaphragm is of course prevented from breaking and electrical characteristics of the piezoelectric diaphragm do not change. Accordingly, the stability of the electrical characteristics of the diaphragm is reliably ensured.

Preferably, end surfaces of the wing portions of each terminal are inclined such that the distance between the end surfaces is increased toward the inside of the housing.

When the terminals are formed by insert molding, end surfaces of the wing portions are surrounded by a resin. Accordingly, when the end surfaces of the wing portions are substantially perpendicular to the inside surface of the housing, there is a risk in that the wing portions will be impeded from moving toward the inside by the resin surrounding the end portions of the wing portions. Accordingly, the end surfaces of the wing portions are inclined so that the wing portions will not be impeded from moving toward the inside of the housing.

Other features, elements, characteristics and advantages of the present invention will become more apparent from the following detailed description of preferred embodiments thereof with reference to the attached drawings.

DETAILED DESCRIPTION OF PREFERRED EMBODIMENTS

FIGS. 1 to 4B illustrate a surface-mountable piezoelectric electroacoustic transducer according to a first preferred embodiment of the present invention.

The electroacoustic transducer of the first preferred embodiment is suitably used in a device which is used in a wide frequency range such as a piezoelectric receiver, and includes a piezoelectric diaphragm 1 having a laminated structure, a case 10, and a cover plate 20. A housing of the piezoelectric electroacoustic transducer is provided by combining the case 10 and the cover plate 20.

Figure 5:
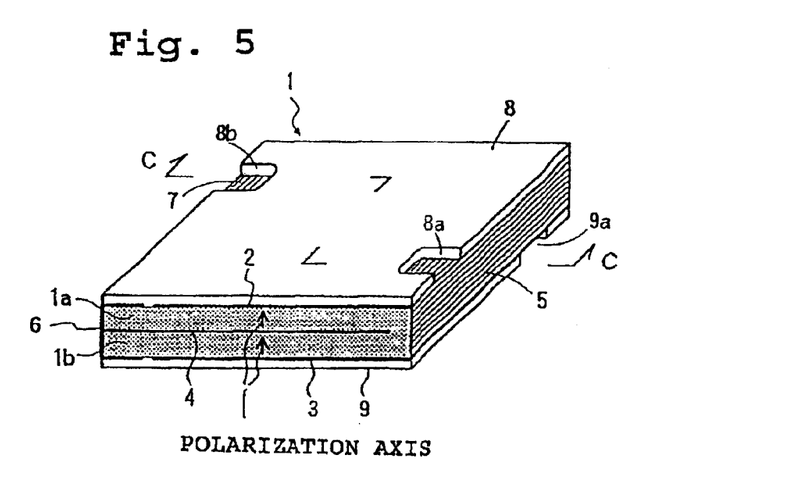
FIG. 5 is a perspective view of a piezoelectric diaphragm installed in the piezoelectric electroacoustic transducer shown in FIG. 1.
Figure 6:
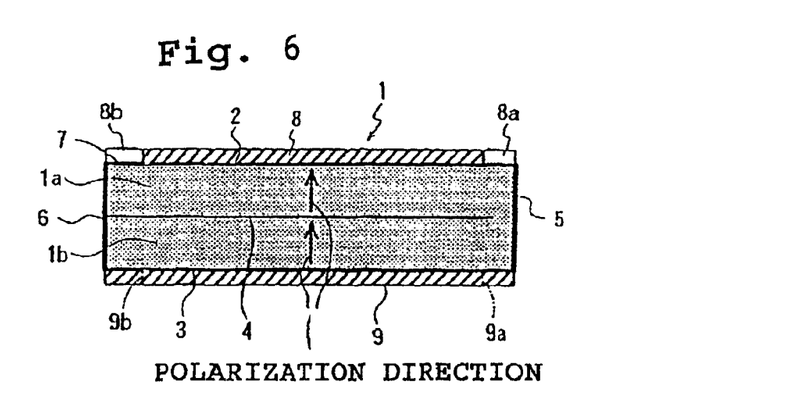
FIG. 6 is a sectional view of FIG. 5 cut along line C—C.

As shown in FIGS. 5 and 6, the diaphragm 1 is preferably formed by laminating two piezoelectric ceramic layers 1a and 1b. Major-surface electrodes 2 and 3 are disposed on major surfaces of the diaphragm 1 at the top and the bottom surfaces thereof, and an internal electrode 4 is disposed between the ceramic layers 1a and 1b. As shown by the thick arrows in FIGS. 5 and 6, the two ceramic layers 1a and 1b are polarized in the same direction in the thickness direction thereof. The major-surface electrode 2 at the top surface and the major-surface electrode 3 at the bottom surface have lengths that are slightly shorter than the side length of the diaphragm 1, and are connected to an end-surface electrode 5 disposed at one of the end surfaces of the diaphragm 1. Accordingly, the major-surface electrodes 2 and 3 at the top and the bottom surfaces are connected to each other. The internal electrode 4 has a shape that is substantially symmetrical to that of the major-surface electrodes 2 and 3. One end of the internal electrode 4 is separated from the end-surface electrode 5, and the other end thereof is connected to an end-surface electrode 6 disposed at the end opposite to the end-surface electrode 5. Auxiliary electrodes 7 are disposed on the top and the bottom surfaces of the diaphragm 1 such that the auxiliary electrodes 7 are electrically connected to the end-surface electrode 6.

In addition, resin layers 8 and 9 are disposed at the top and the bottom surfaces of the diaphragm 1 so as to cover the major-surface electrodes 2 and 3. The resin layers 8 and 9 are provided in order to prevent the diaphragm 1 from breaking when it receives an impact force from being accidentally dropped. The resin layer 8 at the top surface is provided with notches 8a and 8b at positions close to two opposing corners of the diaphragm 1, and the resin layer 9 at the bottom side is provided with notches 9a and 9b at positions close to the other two opposing corners of the diaphragm 1. The major-surface electrodes 2 and 3 face toward the outside through the notches 8a and 9a, respectively, and the auxiliary electrodes 7 face toward the outside through the notches 8b and 9b.

The construction may also be such that the notches are formed at only one of the top and the bottom surfaces of the diaphragm 1. In the present preferred embodiment, however, the notches are formed at both the top and the bottom surfaces of the diaphragm 1 in order to eliminate the directionality.

In addition, it is not necessary for the auxiliary electrodes 7 to have a band-like shape with a constant width, and the auxiliary electrodes 7 may have a shape such that the auxiliary electrodes 7 only extend over regions corresponding to the notches 8b and 9b.

In the present preferred embodiment, the ceramic layers 1a and 1b are preferably formed of PZT ceramic and the size thereof is, for example, approximately 10 mm×10 mm×40 $\mu$m, and the resin layers 8 and 9 are preferably formed of a polyamide-imide resin and the thickness thereof is preferably about 3 $\mu$m to about 10 $\mu$m.

Figure 1:
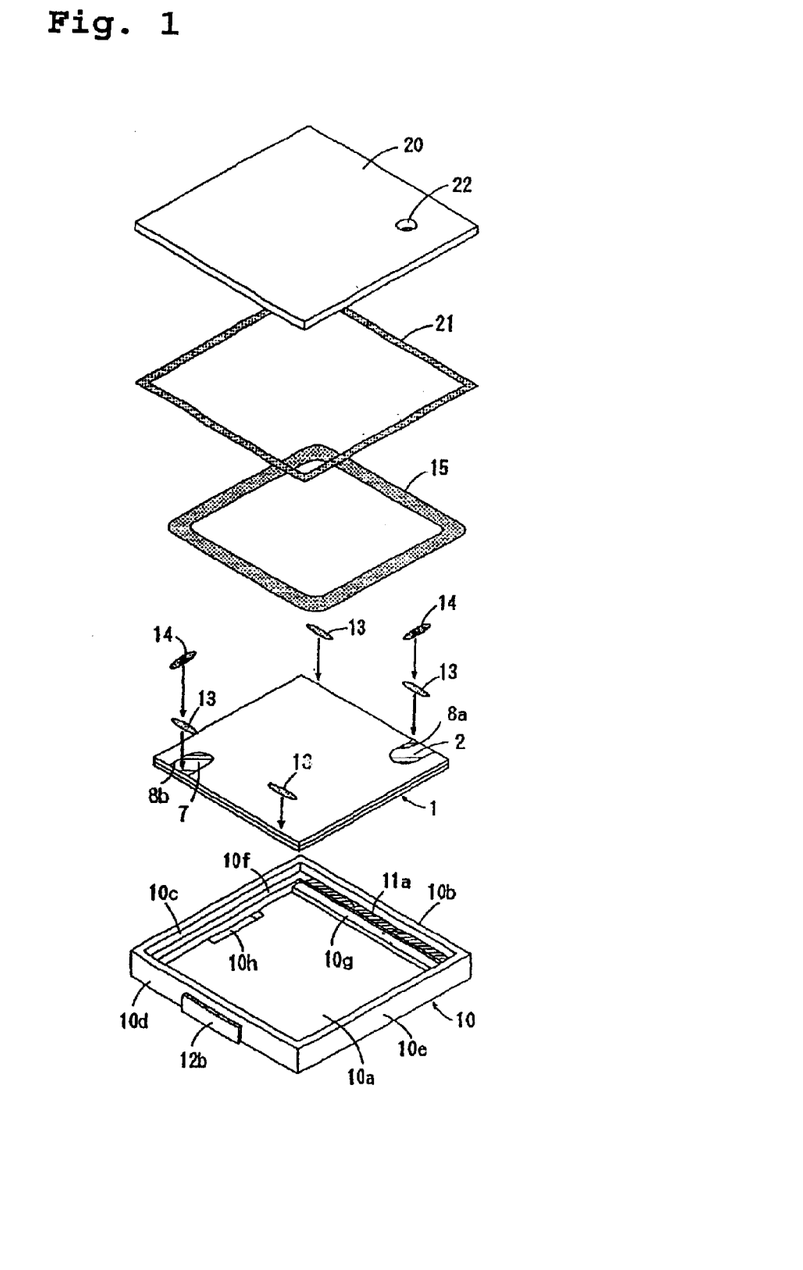
FIG. 1 is an exploded perspective view of a piezoelectric acoustic transducer according to a first preferred embodiment of the present invention.

The case 10 is preferably formed of a resin material and preferably has a substantially rectangular box-shaped configuration having a bottom wall 10a and four side walls 10b to 10e. The resin material for forming the case 10 is preferably a heat-resistant resin such as liquid crystal polymer (LCP), syndiotactic polystyrene (SPS), polyphenylene sulfide (PPS), and epoxy resin. The case 10 is provided with a step portion 10f which extends along the four side walls 10b to 10e, and inner portions 11a and 12a of a pair of terminals 11 and 12 are disposed on the step portion 10f at positions inside two opposing side walls 10b and 10d. The terminals 11 and 12 are formed in the case 10 preferably by insert molding, and are provided with outer portions 11b and 12b, respectively, which are bent along the exterior surfaces of the side walls 10b and 10d toward the bottom surface of the case 10.

Figures 7A, 7B:
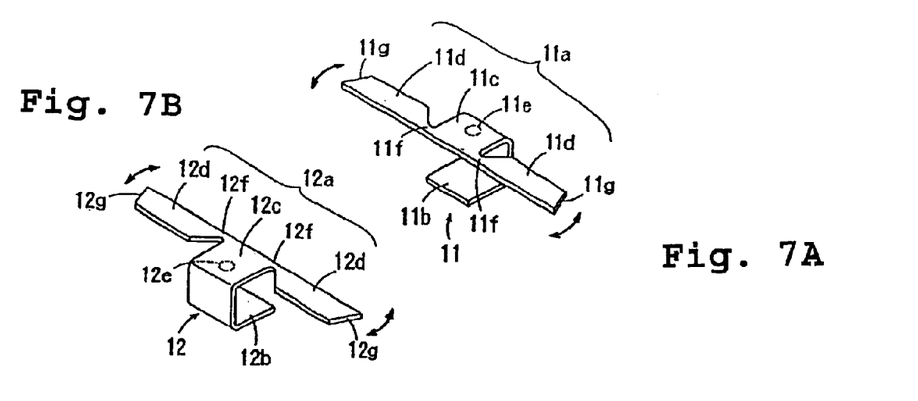
FIGS. 7A and 7B are perspective views of terminals.
Figure 8:
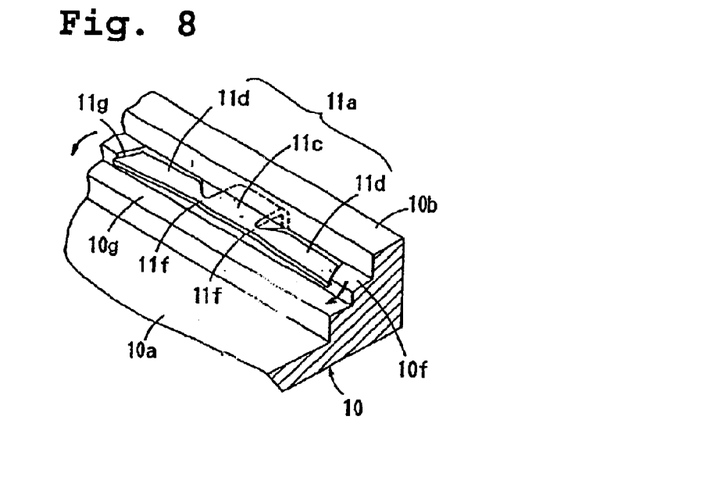
FIG. 8 is a perspective view showing a manner in which one of the terminals moves relative to the case.

As shown in FIGS. 7A to 9, the inner portions 11a and 12a of the terminals 11 and 12 respectively include body portions 11c and 12c having substantially the same width as the outer portions 11b and 12b, wing portions 11d and 12d which extend from both sides of the body portions 11c and 12c to positions close to the corners of the case 10. Although the body portions 11c and 12c are fixed inside the side walls 10b and 10d of the case 10, holes 11e and 12e for allowing a resin to flow therein may be formed in the body portions 11c and 12c in order to ensure the fixing strength. As shown in FIG. 8, the inner surfaces of the wing portions 11d and 12d face toward the inside of the case 10 and stress-relieving portions 11f and 12f are disposed between the body portions 11c and 12c and the wing portions 11d and 12d. Accordingly, the wing portions 11d and 12d are able to move in the directions shown by the arrows in FIGS. 7A and 7B. As shown in FIG. 7A, the end surfaces 11g of the wing portions 11d are inclined such that the distance between the end surfaces 11g is increased toward the inside of the case 10. Similarly, as shown in FIG. 7B, the end surfaces 12g of the wing portions 12d are inclined such that the distance between the end surfaces 12g is increased toward the inside of the case 10. Accordingly, movements of the wing portions 11d and 12d are not impeded by the case 10 formed of resin.

As shown in FIG. 1, supporting portions 10g for supporting the diaphragm 1 at two opposing sides thereof are disposed inside the step portion 10f on which the terminals 11 and 12 are provided. The height of the supporting portions 10g is lower than that of the step portion 10f so that when the diaphragm 1 is disposed on the supporting portion 10g, the top surface of the diaphragm 1 and those of the inner portions 11a and 12a of the terminals 11 and 12 are leveled.

A first sound-emitting hole 10h is formed in the bottom wall 10a.

Figure 10A:
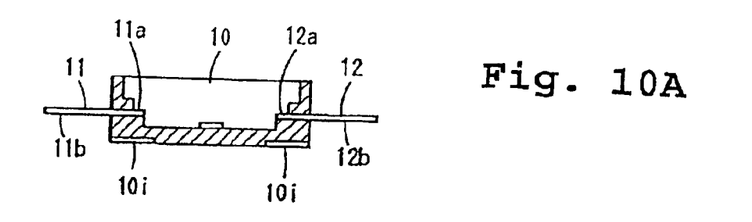
FIGS. 10A to 10C are diagrams showing processes of bending terminals formed in the case by insert molding.
Figure 10B:
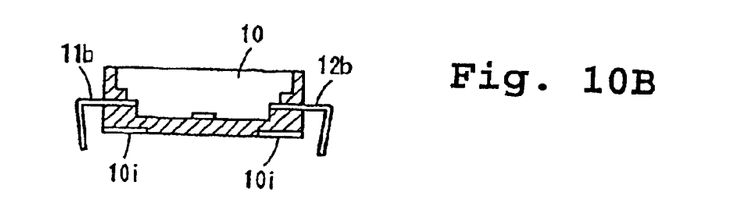
Figure 10C:
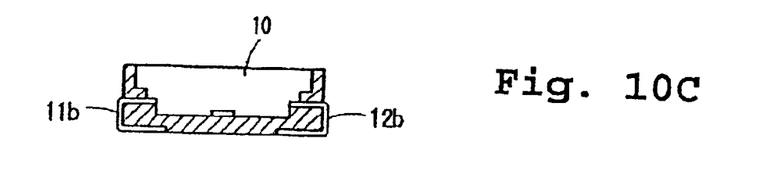

When the terminals 11 and 12 are formed by insert molding, the outer portions 11b and 12b extend horizontally outside the case 10, as shown in FIG. 10A. Then, as shown in FIG. 10B, the outer portions 11b and 12b of the terminals 11 and 12 are bent downward at positions close to the center thereof. At this time, the outer portions 11b and 12b are preferably bent by more than 90 degrees. Then, as shown in FIG. 10C, the outer portions 11b and 12b of the terminals 11 and 12 are bent such that the terminals 11 and 12 extend along the side surfaces of the case 10. In this state, the end portions of the outer portions 11b and 12b are fitted inside grooves 10i formed in the bottom surface of the case 10. Since the outer portions 11b and 12b are bent by more than 90 degrees in FIG. 10B, the end portions of the outer portions 11b and 12b are prevented from being raised from the bottom surface of the case 10.

Figure 2:
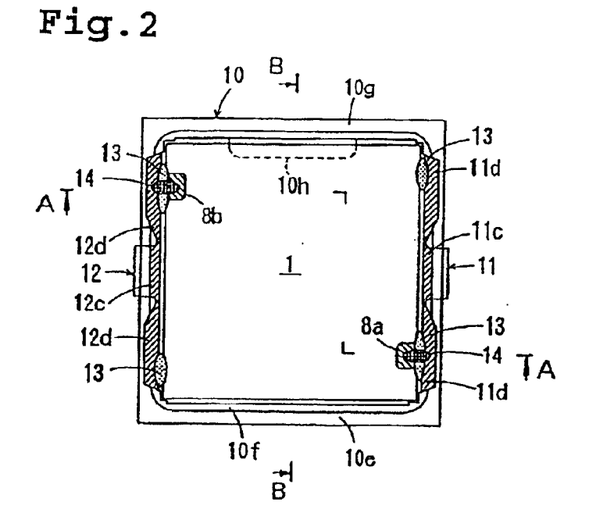
FIG. 2 is a plan view of the piezoelectric electroacoustic transducer shown in FIG. 1 from which a cover plate and an elastic sealing material are removed.
Figure 3A:
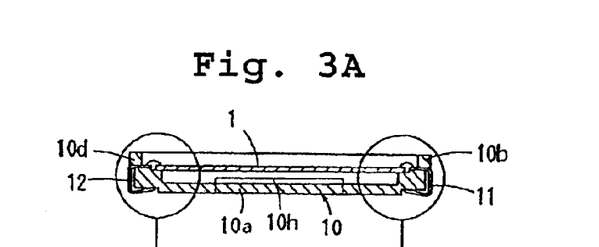
FIG. 3A is a sectional view of FIG. 2 cut along line A—A.
Figures 3B, 3C:
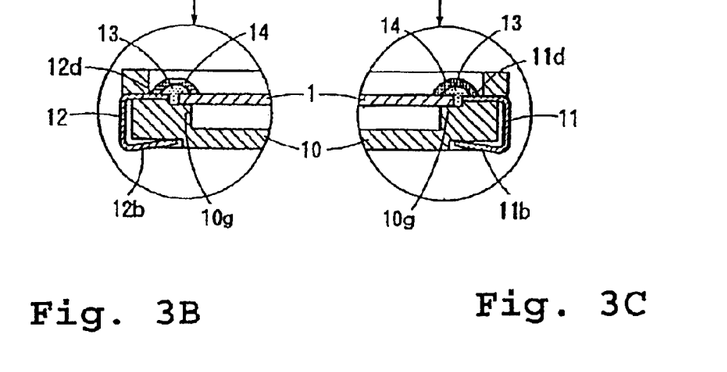
FIGS. 3B and 3C are enlarged views of the circled portions shown in FIG. 3A.

The diaphragm 1 is installed in the case 10 and is fixed to the wing portions 11d and 12d of the terminals 11 and 12 by an elastic restraining material 13 at four positions. More specifically, the elastic restraining material 13 is applied between the major-surface electrode 2 facing toward the outside through the notch 8a and one of the wing portions 11d of the terminal 11 and between the auxiliary electrode 7 facing toward the outside through the notch 8b and one of the wing portions 12d of the terminal 12. In addition, the elastic restraining material 13 is also applied at the remaining two corners which oppose each other. Although the elastic restraining material 13 preferably has a substantially elliptical shape in this preferred embodiment, the shape of the elastic restraining material 13 is not limited to this. A urethane adhesive having a Young's modulus after curing is approximately $3.7 \times 10^6$ Pa, for example, is preferably used as the elastic restraining material 13. Since the elastic restraining material 13 has a large viscosity (for example, about 50 dPa·s to about 120 dPa·s) before curing and a high bleed resistance, it does not flow downward between the diaphragm 1 and the case 10 to the supporting portion 10g. After the elastic restraining material 13 is applied, it is heated and cured.

The elastic restraining material 13 may be applied by using a dispenser or other suitable device after the diaphragm 1 is installed in the case 10, or the diaphragm 1 may be installed in the case 10 after the elastic restraining material 13 is applied thereto.

After the elastic restraining material 13 is cured, the major-surface electrode 2 is connected to one of the wing portions 11d of the terminal 11 and the auxiliary electrode 7 is connected to one of the wing portions 12d of the terminal 12 by applying a conductive adhesive 14 in a substantially elliptical shape such that the conductive adhesive 14 crosses the elastic restraining material 13, which is also applied to have a substantially elliptical shape. A urethane conductive paste having a Young's modulus after curing about $0.3 \times 10^9$ Pa, for example, is preferably used as the conductive adhesive 14. After the conductive adhesive 14 is applied, it is heated and cured. The shape in which the conductive adhesive 14 is applied is not limited to the substantially elliptical shape as long as the major-surface electrode 2 is connected to one of the wing portions 11d of the terminal 11 and the auxiliary electrode 7 to one of the wing portions 12d of the terminal 12 over the elastic restraining material 13.

After the conductive adhesive 14 is applied and cured, an elastic sealing material 15 is applied between the peripheral surface of the diaphragm 1 and the inner surface of the case 10, so that air leakage between the top and the bottom surfaces of the diaphragm 1 is prevented. After the elastic sealing material 15 is applied, it is heated and cured. A silicone adhesive having a Young's modulus after curing of about $3.0 \times 10^5$ Pa, for example, is preferably used as the elastic sealing material 15.

Figures 4A, 4B:
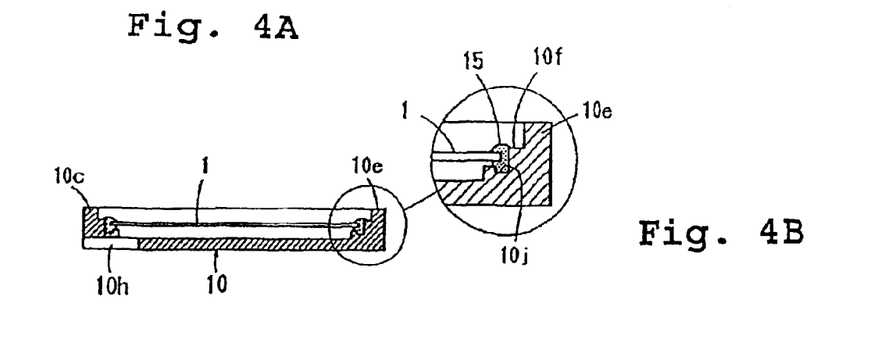
FIG. 4A is a sectional view of FIG. 2 cut along line B—B.
FIG. 4B is an enlarged view of the circled portion shown in FIG. 4A.

As shown in FIG. 4B, flow-stopping grooves 10j for stopping the flow of the elastic sealing material 15 may be formed inside the side walls 10c and 10e at positions that are lower than the supporting portions 10g. In such a case, the elastic sealing material 15 can be prevented from flowing downward to the bottom wall 10a.

After the diaphragm 1 is fixed to the case 10, the cover plate 20 is fixed to the case 10 by an adhesive 21 so as to close the open surface at the upper surface of the case 10. The case 10 and the cover plate 20 are preferably formed of the same material. By attaching the cover plate 20, an acoustic space is defined between the diaphragm 1 and the cover plate 20. A second sound-emitting hole 22 is formed in the cover plate 20. Accordingly, the surface-mountable piezoelectric electroacoustic transducer is completed.

According to the electroacoustic transducer of the present preferred embodiment, the diaphragm 1 starts to vibrate in bending vibration mode when a predetermined alternating current is applied between the terminals 11 and 12. Since one of the piezoelectric ceramic layers having a polarization direction that is the same as the direction of the electric field contracts and the other one of the piezoelectric ceramic layers having a polarization direction that is opposite to the direction of the electric field expands, the laminate bends in the thickness direction.

In the present preferred embodiment, the diaphragm 1 has a laminated structure and is formed of ceramic, and two vibrating areas (ceramic layers) aligned in the thickness direction vibrate in the opposite directions. Accordingly, compared with a unimorph-type diaphragm, the diaphragm is bent by a large amount and a large sound pressure is thereby obtained.

When the electroacoustic transducer according to the present preferred embodiment is surface-mounted on a printed board, etc., the case 10 expands in a reflow-soldering process due to heat. Since the coefficient of thermal expansion of the diaphragm 1 that is made of ceramic is smaller than that of the case 10 formed of resin, the diaphragm 1 receives a tensile stress. Accordingly, there is a risk that the characteristics of the diaphragm 1 will change or the diaphragm 1 will break.

Figure 9:
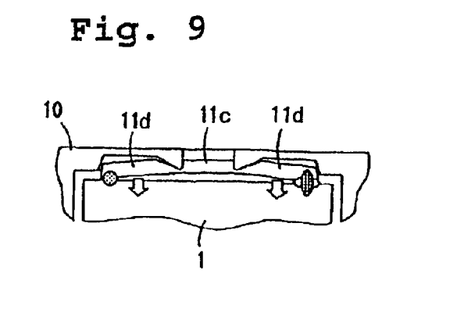
FIG. 9 is a plan view showing a manner in which one of the terminals moves relative to the case.

However, since the wing portions 11d and 12d of the terminals 11 and 12 formed in the case 10 by insert molding are able to move toward the inside of the case 10, as shown in FIG. 9, the tensile stress applied to the diaphragm 1 is relieved. Accordingly, the characteristics of the diaphragm 1 do not change and the diaphragm 1 is prevented from breaking.

Figure 11:
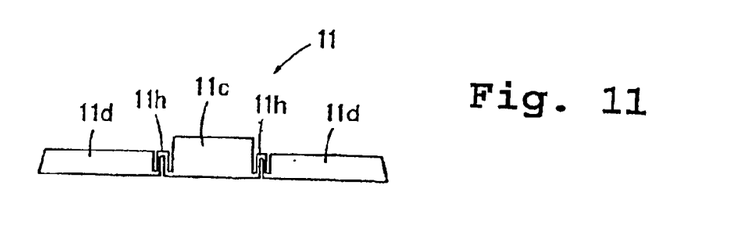
FIG. 11 is a plan view showing another example of a terminal.

FIG. 11 shows a modification of the terminals according to another preferred embodiment of the present invention. Since the terminals 11 and 12 preferably have the same construction, only the terminal 11 is shown in FIG. 11.

In the terminals 11 and 12 of the present preferred embodiment, crank-shaped portions 11h and 12h are disposed between the body portions 11c and 12c and the wing portions 11d and 12d which define the stress-relieving portions. In this case, the wing portions 11d and 12d are able to move more easily compared with the case in which the stress-relieving portions are defined by the narrow portions 11f and 12f according to the first preferred embodiment of the present invention.

Figure 12:
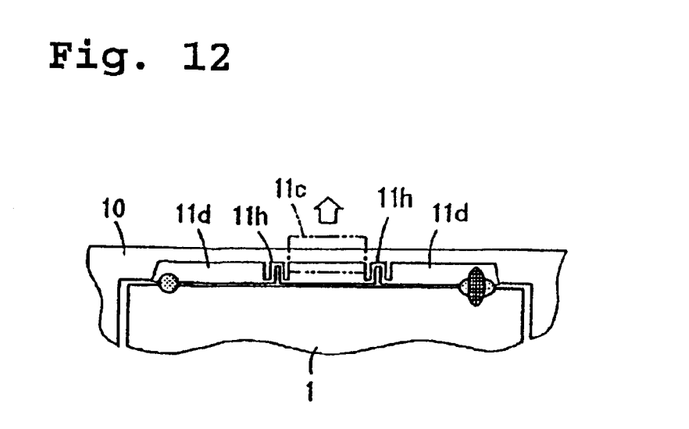
FIG. 12 is a plan view showing a portion of a piezoelectric electroacoustic transducer according to a second preferred embodiment of the present invention from which a cover plate and an elastic sealing material are removed.

FIG. 12 shows a portion of an electroacoustic transducer according to a second preferred embodiment of the present invention. Since the terminals 11 and 12 preferably have the same construction, only a portion including the terminal 11 is shown in FIG. 12.

In the present preferred embodiment, the above-described crank-shaped portions 11h and 12h, which define the stress-relieving portions, are disposed between the body portions 11c and 12c and the wing portions 11d and 12d of the terminal 11 and 12, and the wing portions 11d and 12d of the terminals 11 and 12 are immovably fixed to the case 10. Accordingly, the body portions 11c and 12c are able to move relative to the side walls 10b and 10d of the case 10. In this case, the above-described holes 11e and 12e for allowing the resin to flow therein are not formed in the body portions 11c and 12c.

In the present preferred embodiment, the body portions 11c and 12c of the terminal move inward and outward so that the stress applied to the outer portions 11b and 12b of the terminals 11 and 12 from the printed board on which the device is surface-mounted is relieved. The displacements of the body portions 11c and 12c are absorbed by the stress-relieving portions 11h and 12h disposed between the body portions 11c and 12c and the wing portions 11d and 12d. Although the stress-relieving portions 11h and 12h having the construction shown in FIG. 11 is preferably provided in the present preferred embodiment, the above-described narrow portions 11f and 12f having the construction shown in FIGS. 7A and 7B may also be used.

The present invention is not limited to the above-described preferred embodiments, and various modifications are possible within the scope of the present invention.

For example, although the piezoelectric diaphragm used in the above-described preferred embodiments is preferably formed by laminating two piezoelectric ceramic layers, it may also be formed by laminating three or more piezoelectric ceramic layers.

In addition, the piezoelectric diaphragm is not limited to a laminate of piezoelectric ceramic layers, and it may also be formed as a unimorph-type or bimorph-type diaphragm in which a piezoelectric plate is laminated on one or both sides of a metal plate.

In addition, the construction of the terminals 11 and 12 is not limited such that the wing portions 11d and 12d are disposed at both sides of the body portions 11c and 12c, and a single wing portion which is electrically connected to the diaphragm may be formed at one side of each body portion.

In addition, supporting portions which support the diaphragm at four corners may be used instead of the supporting portions 10g disposed at two sides of the case 10.

In addition, the housing of the present invention is not limited to the above-described preferred embodiments in which the housing is formed by combining the box-shaped case and the cover plate as long as the terminals can be formed by insert molding.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A piezoelectric electroacoustic transducer comprising:
   a piezoelectric diaphragm including electrodes and having a substantially rectangular shape, the piezoelectric diaphragm vibrating in the thickness direction when an alternating current is applied between the electrodes of the piezoelectric diaphragm;
   a housing in which the piezoelectric diaphragm is disposed and which includes supporting portions for supporting the piezoelectric diaphragm at at least two opposing sides of the piezoelectric diaphragm or at corners of the piezoelectric diaphragm; and
   a pair of terminals disposed in the housing such that a first end of each terminal is inserted inside the housing at a position close to the supporting portions and a second end of each terminal is disposed outside the housing; wherein
   the first end of each of the terminals includes a body portion fixed to the housing, wing portions which extend from both sides of the body portion toward the corners of the housing and which are not fixed to the housing, and stress-relieving portions disposed between the body portion and the wing portions such that the wing portions are able to move toward the inside of the housing, and each of the electrodes of the piezoelectric diaphragm is connected to at least one of the wing portions of the terminals.

2. A piezoelectric electroacoustic transducer according to claim 1, wherein the terminals are insert molded in the housing.

3. A piezoelectric electroacoustic transducer according to claim 1, wherein end surfaces of the wing portions of each of the terminals are inclined such that the distance between the end surfaces is increased toward the inside of the housing.

4. A piezoelectric electroacoustic transducer according to claim 1, wherein the housing includes a case and a cover plate disposed thereon.

5. A piezoelectric electroacoustic transducer according to claim 1, wherein the piezoelectric diaphragm includes at least two piezoelectric ceramic layers laminated on each other.

6. A piezoelectric electroacoustic transducer according to claim 5, wherein the at least two piezoelectric layers are disposed in the same thickness direction thereof.

7. A piezoelectric electroacoustic transducer according to claim 1, wherein an internal electrode is disposed between the at least two piezoelectric layers.

8. A piezoelectric electroacoustic transducer according to claim 1, wherein the piezoelectric diaphragm includes resin layers disposed on the electrodes of the piezoelectric diaphragm.

9. A piezoelectric electroacoustic transducer according to claim 8, wherein at least one of the resin layers has notches formed therein at positions close to opposing corners of the piezoelectric diaphragm.

10. A piezoelectric electroacoustic transducer according to claim 1, wherein holes are formed in the body portions of each of the terminals.

11. A piezoelectric electroacoustic transducer comprising:
 a piezoelectric diaphragm including electrodes and having a substantially rectangular shape, the piezoelectric diaphragm vibrating in the thickness direction when an alternating current is applied between the electrodes of the piezoelectric diaphragm;
 a housing which stores the piezoelectric diaphragm and which includes supporting portions for supporting the piezoelectric diaphragm at at least two opposing sides of the piezoelectric diaphragm or at corners of the piezoelectric diaphragm; and
 a pair of terminals disposed such that a first end of each terminal is inserted inside the housing at a position close the supporting portions and a second end of each terminal is disposed outside the housing; wherein
 the first end of each terminal includes a body portion fixed to the housing, a wing portion which extends from one side of the body portion toward one of the corner of the housing and which is not fixed to the housing, and a stress-relieving portion disposed between the body portion and the wing portion such that the wing portion is able to move toward the inside of the housing, and each electrode of the piezoelectric diaphragm is connected to the wing portion of the terminals.

12. A piezoelectric electroacoustic transducer according to claim 11, wherein the terminals are insert molded in the housing.

13. A piezoelectric electroacoustic transducer according to claim 11, wherein end surfaces of the wing portions of each of the terminals are inclined such that the distance between the end surfaces is increased toward the inside of the housing.

14. A piezoelectric electroacoustic transducer according to claim 11, wherein the housing includes a case and a cover plate disposed thereon.

15. A piezoelectric electroacoustic transducer according to claim 11, wherein the piezoelectric diaphragm includes at least two piezoelectric ceramic layers laminated on each other.

16. A piezoelectric electroacoustic transducer according to claim 15, wherein the at least two piezoelectric layers are disposed in the same thickness direction thereof.

17. A piezoelectric electroacoustic transducer according to claim 11, wherein an internal electrode is disposed between the at least two piezoelectric layers.

18. A piezoelectric electroacoustic transducer according to claim 11, wherein the piezoelectric diaphragm includes resin layers disposed on the electrodes of the piezoelectric diaphragm.

19. A piezoelectric electroacoustic transducer according to claim 18, wherein at least one of the resin layers has notches formed therein at positions close to opposing corners of the piezoelectric diaphragm.

20. A piezoelectric electroacoustic transducer according to claim 12, wherein holes are formed in the body portions of each of the terminals.

* * * * *